United States Patent
Iwatsu et al.

(10) Patent No.: US 6,425,516 B1
(45) Date of Patent: Jul. 30, 2002

(54) SEMICONDUCTOR DEVICE AND METHOD OF PRODUCTION OF THE SAME

(75) Inventors: Satoshi Iwatsu; Toshiaki Iwafuchi; Takashi Saito, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/558,863

(22) Filed: Apr. 27, 2000

(30) Foreign Application Priority Data

Apr. 27, 1999 (JP) .......................................... 11-120074

(51) Int. Cl.⁷ .......................... B23K 31/02; H01L 21/44
(52) U.S. Cl. ................. 228/180.22; 228/199; 438/106; 438/612; 257/780
(58) Field of Search ........................ 228/180.22, 199; 438/106, 612; 257/780

(56) References Cited

U.S. PATENT DOCUMENTS

| | | | | |
|---|---|---|---|---|
| 4,754,912 A | * | 7/1988 | Burns | 228/164 |
| 5,488,200 A | * | 1/1996 | Tsukada | 174/261 |
| 5,600,180 A | * | 2/1997 | Kusaka et al. | 257/692 |
| 5,604,379 A | * | 2/1997 | Mori | 257/738 |
| 5,731,229 A | * | 3/1998 | Kato et al. | 438/50 |
| 5,777,391 A | * | 7/1998 | Naklamura et al. | 257/778 |
| 5,811,351 A | * | 9/1998 | Kawakita et al. | 438/613 |
| 5,897,337 A | * | 4/1999 | Kata et al. | 438/114 |
| 5,989,982 A | * | 11/1999 | Yoshikazu | 438/462 |
| 6,063,646 A | * | 5/2000 | Okuna et al. | 438/107 |
| 6,118,179 A | * | 9/2000 | Farnworth et al. | 257/734 |
| 6,168,972 B1 | * | 1/2001 | Wang et al. | 438/108 |
| 6,171,887 B1 | * | 1/2001 | Yamaji | 438/106 |
| 6,180,504 B1 | * | 1/2001 | Farnworth et al. | 438/612 |
| 6,181,569 B1 | * | 1/2001 | Chakravorty | 361/761 |
| 6,260,264 B1 | * | 7/2001 | Chen et al. | 29/832 |

FOREIGN PATENT DOCUMENTS

| | | | |
|---|---|---|---|
| JP | 09-306952 A | * | 11/1997 |
| JP | 11-238760 A | * | 8/1999 |
| JP | 2001-119132 | * | 4/2001 |

* cited by examiner

Primary Examiner—Tom Dunn
Assistant Examiner—L. Edmondson
(74) Attorney, Agent, or Firm—Sonnenschein, Nath & Rosenthal

(57) ABSTRACT

A semiconductor device comprising a semiconductor substrate on which metal bumps having narrowed base portions are bonded and coated on its top surface with a resin covering the base portions of the metal bumps, improving reliability of the bump bonds. Also, a method of production of a semiconductor device including steps of forming metal bumps in a wafer state, coating a resin for protecting a wiring surface of a semiconductor chip in the wafer state and cutting the semiconductor chip from the wafer, wherein the metal bumps have narrowed base portions and are bonded to the wiring surface of the semiconductor chip and the resin is coated covering the base portions of the metal bumps.

7 Claims, 5 Drawing Sheets

C PORTION

SEMICONDUCTOR DEVICE AND METHOD OF PRODUCTION OF THE SAME

RELATED APPLICATION DATA

The present application claims priority to Japanese Application No. P11-120074 filed Apr. 27,1999, which application is incorporated herein by reference to the extent permitted by law.

BACKGROUND OF THE INVENTION

1. Field of the Invention

The present invention relates to a semiconductor device and method of production of the same, more particularly relates to an improvement or increasing the strength of a bond of a metal bump.

2. Description of the Related Art

In chip size packages (CSP) and other semiconductor devices of the flip-chip type, wiring surfaces of the IC chips directly face the boards and are bonded conductively with wiring patterns of the boards via conductor bonds formed by solder, gold, copper, or alloys of the same. However, a semiconductor IC chip is generally comprised by silicon and therefore has a linear expansion rate with respect to heat much different from that of a circuit board, which is comprised mainly of a resin, so stress arises due to the difference of the amount of expansion by the heat received from the chip and surroundings at the time of actual use. In most cases, the portions most susceptible to stress are the bonds between the packaged IC chip and the board. In particular, in the case of the flip-chip type, since there are no leads and few portions for relieving stress, it is necessary to improve the reliability of the bonds.

In the flip-chip type package of the related art, the reliability of the bonds was increased by the method of filling the space between the board and the chip with a resin so as to increase the reliability of the bonds. However, this method made the reworkability of the package worse. Accordingly, a method of bonding a board and an IC chip by only solder which gives a high reliability of bonds has been desired.

Among flip-chip types, in a structure such as an encapsulated bump chip (EBC) to be packaged at the wafer level (see later explained FIG. 6A), in the method of production, a resin is applied for protecting the wafer surface by spin-coating, so the thickness of the coating resin is affected by the Young's modulus and viscosity of the resin.

The material properties of the resin may be selected in innumerable ways. If just using the resin as a wiring protection film, a resin having a low Young's modulus and low viscosity may be used, but to give the resin the function of improving the bond reliability of the bumps and impart the property of enabling the resin to be coated to a uniform height within a predetermined time at the time of the spin-coating, it is necessary to suitably select the resin used.

Further, the thickness of coating of the resin has a large effect on the action of reinforcing the bonding surface of the bumps, particularly the bonding surface with the IC chip, due to the later explained reason, so it is necessary to set a suitable thickness of coating.

FIG. 6A shows the state of bonding between the solder bumps of the semiconductor package (EBC) and board.

A semiconductor chip 2 is mounted on the board 1. The semiconductor chip 2 is bonded on the board 1 via primary solder bumps 3 and secondary solder bumps 4.

When the semiconductor package (semiconductor device) drops in temperature, a contraction force acts on the board 1 and the semiconductor chip 2 as shown by A and B, respectively. In this case, due to the difference of the linear expansion rates, the amount of contraction A of the board 1 becomes larger than the amount of contraction B of the semiconductor chip 2. Accordingly, as shown in FIG. 6B, due to the difference of expansion (difference of amounts of contraction), the package deforms and a tensile stress C arises at the bonds of the solder bumps as shown in FIG. 6C.

There are three locations which may be destroyed by the stress received by the solder bumps: between the chip and the solder, between the board and the solder, and between the primary bumps and the secondary bumps. In forming the bumps, however, if the bonding areas are equal, the location which may be destroyed first usually becomes the location between the chip and the solder. The reason is that on the board side, the Young's modulus of the board itself is low, so the strain is absorbed immediately below the solder bonding surface, and, on the IC chip bonding surface side, there is no relief mechanism for absorbing such strain. Further, if the solder and the for example Cu of the bonds are exposed to a high temperature to form an alloy, the layer ends up becoming brittle, and, in the production process, the frequency of exposure to heat is greater at the bonding surface with the IC.

Namely, in a structure of the flip-chip type, when maintaining the bond with the board by solder bonding, if the bonding areas between the IC chip and the solder and between the board and the solder are substantially the same, it is important to increase the bond strength between the IC chip and the solder in order to improve the solder bonds life.

The state of occurrence of stress between the IC chip and solder is shown in FIGS. 6B and 6C as explained above.

For example, assume that a board mounted with an IC chip is cooled from 100° C. to 0° C. The deformation of the board at this time becomes the warping state as shown in FIG. 6B due to the larger amount of contraction of the board compared with the IC chip. The stress mainly acting on the solder in this case is the tensile stress as shown in FIG. 6C.

Summarizing the problems to be solved by the invention, as a result of such a tensile stress, the base portion of the solder bond easily cracks making destruction of that portion easier. In particular, when a bump is shaped so that base portion of the solder narrows and therefore becomes thinner than the center portion, the effect of such heat stress becomes larger.

SUMMARY OF THE INVENTION

An object of the present invention is to provide a semiconductor device comprising a chip bonded to a board via bumps wherein the reliability of the bump bonds is improved and a method of production of the same.

According to a first aspect of the present invention, there is provided a semiconductor device comprising a semiconductor substrate on which metal bumps having narrowed base portions are bonded and coated on its top surface with a resin covering the base portions of the metal bumps.

Preferably, the resin has a Young's modulus of not less than about 1200 kgf/mm$^2$, a linear expansion rate of not more than about 20 ppm/° C., and a thickness of about 40 $\mu$m to about 110 $\mu$m.

Preferably, the metal bumps have polished upper surfaces and a difference in height between the polished upper surfaces and a surface at the smallest coating thickness portion of the resin is about 10 $\mu$m to about 50 $\mu$m.

Preferably, the resin is inclined in a flared shape at the base portions of the metal bumps and buries the base portions.

According to a second aspect of the present invention, there is provided a method of production of a semiconductor device including the steps of forming metal bumps in a wafer state, coating a resin for protecting a wiring surface of a semiconductor chip in the wafer state and cutting the semiconductor chip from the wafer, wherein the metal bumps have narrowed base portions and are bonded to the wiring surface of the semiconductor chip and the resin is coated covering the base portions of the metal bumps.

Preferably, the resin is coated by a spin coating method, and a Young's modulus of the resin is not less than about 1200 kgf/mm$^2$, a linear expansion rate is not more than about 20 ppm/° C., and a thickness is about 40 µm to about 110 µm.

Preferably, the method further comprises a step of polishing surfaces of the metal bumps in the water state, wherein a difference in height between the polished surfaces and a surface at the smallest coating thickness portion of the resin is about 10 µm to about 50 µm.

Preferably, the resin is coated so that the resin is inclined in a flared shape at the base portions of the metal bumps and buries the base portions.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

The first embodiment provides a semiconductor device comprising a semiconductor substrate on which metal bumps having narrowed base portions are bonded and coated on its top surface with a resin covering the base portions of the metal bumps.

According to this configuration, since the base portions of the metal bumps, where the base portions of bump bonds are thin, are reinforced by being covered with the resin, the bond reliability is improved.

Figures 1A, 1B:
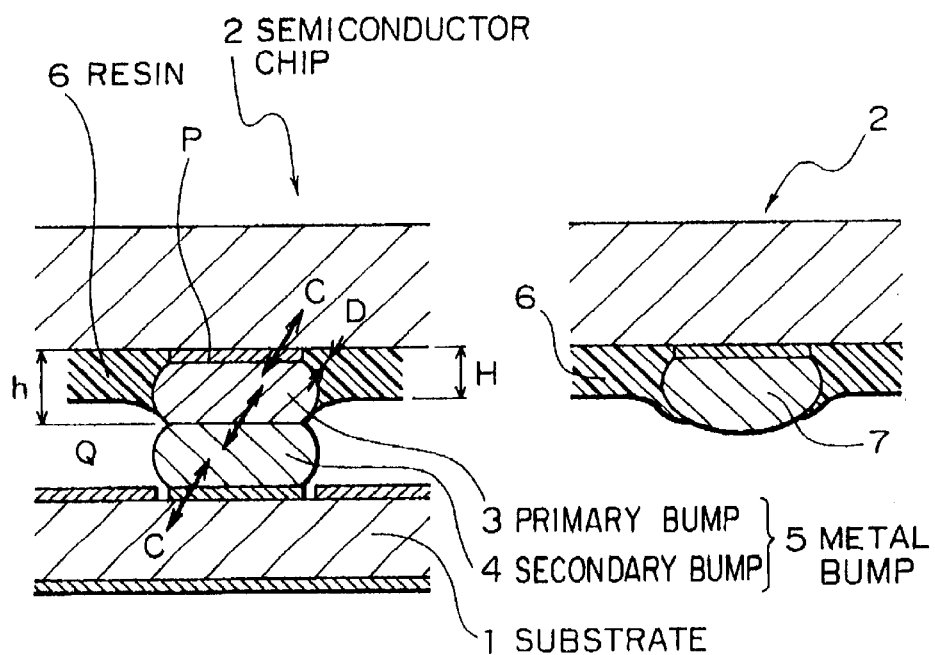
FIGS. 1A and 1B are explanatory views of the basic configuration of the present invention.

Explaining the principle of the reinforcing action further, in the present embodiment, the board 1 and semiconductor chip 2 are, as shown in FIG. 1A, bonded by solder or other metal bumps 5 comprised of primary bumps 3 and secondary bumps 4 and a circuit forming surface (lower surface in the figure) of the semiconductor chip 2 is covered with the resin 6 for protection. The base portions of the bonds of the metal bumps 5 are covered and buried with the resin 6.

In such a configuration, as explained above, heat stress arises when the temperature drops, a tensile stress C acts on the bonding surface P between the metal bumps 5 and the semiconductor chip 2, and the tensile stress C acts in the direction of breaking the bonds of the base portions of the metal bumps 5. As a countermeasure for this, in the configuration of the present invention, the resin 6 coated on the semiconductor chip 2 generates the contraction force D at the time of being cooled as shown in FIG. 1A. The contraction force D acts in a direction canceling the breaking action by the tensile stress C. As a result, the base portions of the metal bumps 5 are reinforced, the bonding strength of the bonding surface P is increased, the bond reliability is improved, the bond life becomes longer, and a stable function is attained for a long period of time.

In a preferable example of the configuration, the resin has a Young's modulus of not less than about 1200 kgf/mm$^2$, a linear expansion rate of not more than about 20 ppm/° C., and a thickness of about 40 µm to about 110 µm.

By making the Young's modulus of the resin not less than about 1200 kgf/mm$^2$ according to this configuration, a practical effect of reduction of the stress by the resin is obtained. In this case, the upper limit is not particularly limited. It is sufficient if it is within the range of the Young's modulus obtained with ordinary resin materials. Similarly, by making the linear expansion rate not more than about 20 ppm/° C., a practical effect of the reduction of the stress is obtained. By making the thickness of the resin about 40 to 110 µm, a practical effect of reduction of stress is obtained (see later explained FIG. 2).

Figure 2:
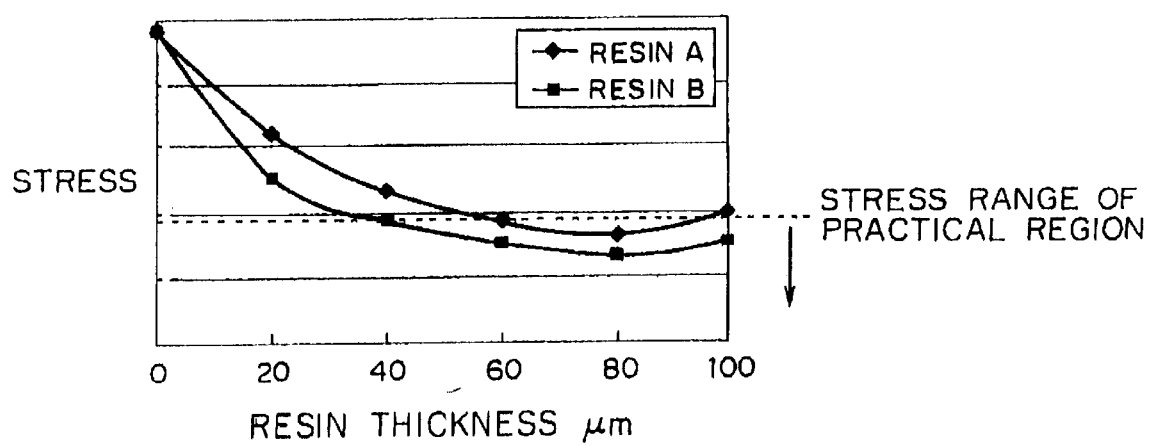
FIG. 2 is a graph of effects of the present invention.

FIG. 2 shows the effects of the reduction of the stress by two types of resins. The resin A has a Young's modulus of 720 kgf /mm$^2$ and a linear expansion rate of 34 ppm/° C., while the resin B has a Young's modulus of 1430 kgf/mm$^2$ and a linear expansion rate of 17 ppm/° C. It can be understood that a larger effect can be obtained when the Young's modulus is higher than when it is lower. In this case, in order to apply the resin to a uniform thickness of for example 40 µm or more on a wafer by spin-coating, a resin having a Young's modulus high enough to a certain extent has to be used. Accordingly, it is possible to make the thickness of the resin larger greater so as to use a resin having a higher Young's modulus and thereby obtain a synergistic effect.

In a further preferable example of the configuration, the metal bumps have polished upper surfaces and a difference in height between the polished upper surfaces and a surface at the smallest coating thickness portion of the resin is about 10 µm to about 50 µm.

By making the difference of height of the upper surface of the bump and the upper surface of the resin about 10 µm to 50 µm according to this configuration, a suitable, well-balanced contraction force of the resin acts on the bonding surface of the chip side and the bonding surface of the board side and a suitable effect of reduction of the stress is obtained. When the difference is less than 10 µm, the breaking force from the resin acting on the bonding surface of the board side becomes too strong, while when the difference becomes more than 50 µm, the action of reduction of the stress on the bonding surface of the chip side becomes too small.

Explaining this further, in FIG. 1A, when the coating height (thickness) H of the resin 6 is made the same as the height h of the primary bumps 3, the action by the contraction force D of the resin 6 becomes a tensile stress when seen from the bonding surface Q, so the breaking force acting on the bonding surface Q conversely becomes larger.

Accordingly, when seen from the bonding surface P, the greater the thickness of the resin 6, the better, but if too great, the breaking force acting on the bonding surface Q is increased.

The relationship between the stress acting on the solder bonds and the thickness of the resin is graphed in the above FIG. 2. The graph shows the stress amplitude due to the temperature cycle of the solder portion when the height of the primary bumps is made 110 μm. When the thickness of the resin is small, the stress on the bonding surface P is high, while when the thickness of the resin becomes greater, the stress of the bonding surface Q becomes higher, so it is learned that there is a suitable value (extreme) of the thickness of the resin with respect to the stress of the solder.

The value of the extreme varies somewhat in accordance with the size of the chip, type of the board, etc., but when the height of the primary bumps is h, the suitable value (extreme) is about 10 to 50 μm lower than h. Note that in this case, when spin-coating the resin, the resin rises as shown in FIG. 1B to cover the side surfaces of the bumps 7 due to the surface tension, so which height should be referred to as the thickness of the resin becomes a problem, but the thickness of the resin spoken of here refers to a thickness at a portion not affected by the surface tension.

In a preferable example of the configuration, the resin is inclined in a flared shape at the base portions of the metal bumps and buries the base portions.

According to this configuration, since the resin covers the base portions of the bumps in a flared shape, there is no waste in the shape, the strength of reinforcement is improved, and the bond reliability of is further improved.

The present embodiment further provides a method of production of a semiconductor device including steps of forming metal bumps in a wafer state, coating a resin for protecting a wiring surface of a semiconductor chip in the wafer state, and cutting the semiconductor chip from the wafer, wherein the metal bumps have narrowed base portions and are bonded to the wiring surface of the semiconductor chip and the resin is coated covering the base portions of the metal bumps.

This enables the above explained semiconductor device of the present embodiment to be suitably produced.

In such a method of production, preferably the resin is coated by a spin-coating method and, as mentioned above, the Young's modulus of the resin is not less than about 1200 kgf/mm$^2$, the linear expansion rate is not more than about 20 ppm/° C., and the thickness is about 40 μm to about 110 μm.

More preferably, the method further comprises a step of polishing surfaces of the metal bumps in the water state, wherein a difference in height between the polished surfaces and a surface at the smallest coating thickness portion of the resin is about 10 μm to about 50 μm.

In this method of production, more preferably the resin is coated so that, as explained above, the resin is inclined in a flared shape at the base portions of the metal bumps and buried the base portions.

Second Embodiment

FIGS. 3A to 3D are sectional views of key parts of the process of production of a semiconductor device according to the second embodiment of the present invention.

Figure 3A:
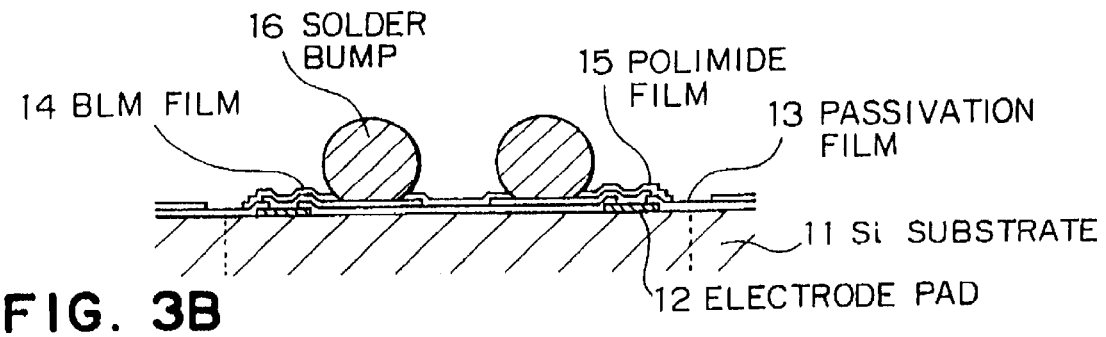
FIGS. 3A to 3D are explanatory views of steps in a method of production of a semiconductor device of the present invention.

As shown in FIG. 3A, an aluminum (Al) electrode pad 12 is formed on a Si substrate 11 in a water state, and a passivation film 13 comprised of $Si_3N_4$ and a polyimide film is provided. On the Si substrate 11 is formed a ball limiting metal (BLM) film 14 connected to the electrode pad, rearranging bonding portions. Also, a polyimide film 15 is provided for protecting the outermost surface and for giving a bump wet surface. Solder bumps 16 are bonded on the BLM film 14.

Figure 3B:
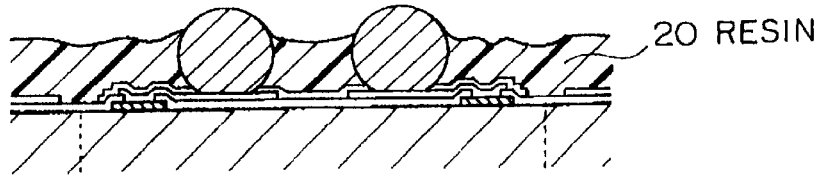

Next, as shown in FIG. 3B, a resin 20 is coated by the spin-coating method on the Si substrate 11 in the wafer state. As the resin 20, an epoxy-based resin, for example, 1,6-bis (2,3-epoxypropoxy)naphthalene may be used. This corresponds to the resin A in FIG. 2 in the above explanation. The relationship of height with the thickness of the coating and the bumps is as explained above.

Figure 3C:
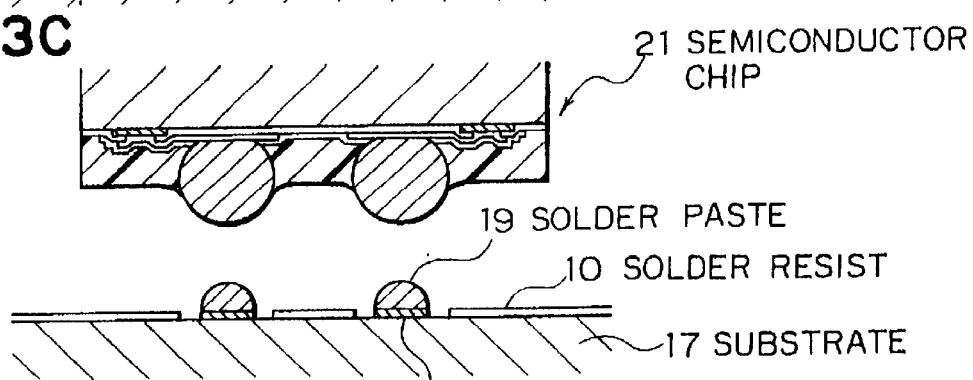

Next, as shown in FIG. 3C, the semiconductor chip 21 of the above configuration is cut from the wafer by a dicing process and made to face the board 17. Electrodes 18 are formed on the board 17 and a solder paste 19 is provided thereon. An upper surface of the board is covered by a solder resist 10.

Figure 3D:
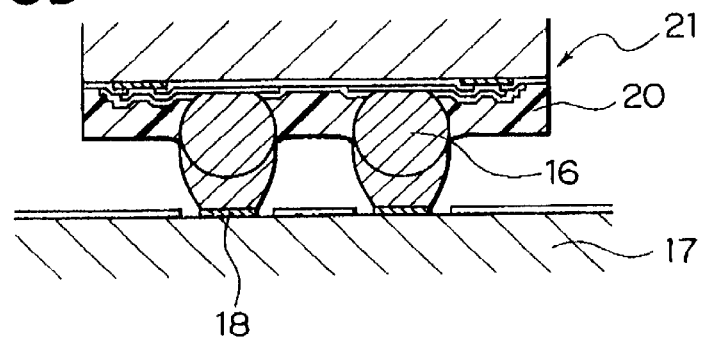

Next, as shown in FIG. 3D, the semiconductor chip 21 is bonded by the flip-chip system to the board 17, and the electrodes 18 of the board 17 and the solder bumps 16 are connected.

Third Embodiment

FIGS. 4A to 4D and 5A to 5C are more detailed explanatory views of a method of production of a semiconductor device according to the third embodiment of the present invention.

Figure 4A:
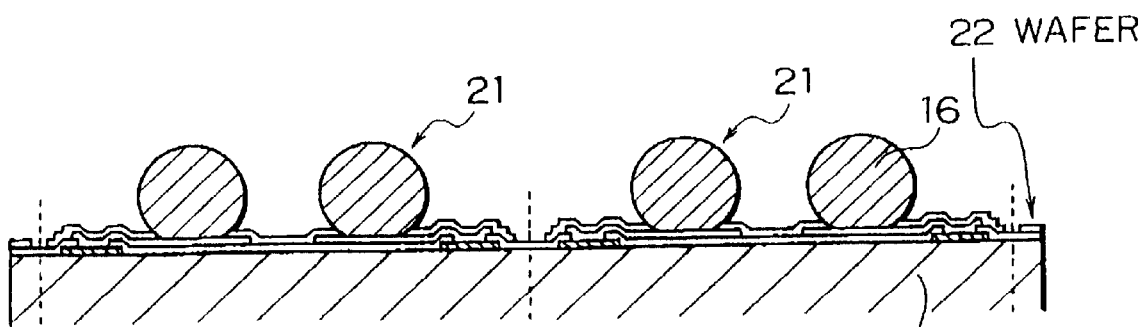
FIGS. 4A to 4D are explanatory views of steps in another method of production of a semiconductor device of the present invention.

In this embodiment, first, as shown in FIG. 4A, a plurality of semiconductor chips 21 are formed on the Si substrate 11 of a wafer 22. The configuration of each semiconductor chip 21 is the same as that explained above with reference to FIGS. 3A to 3D.

Figure 4B:
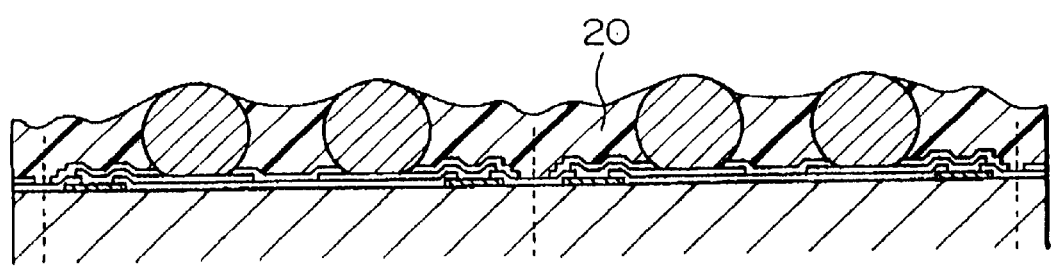

Next, as shown in FIG. 4B, the resin 20 is coated by spin-coating on the Si substrate 11 in the state of the wafer 22. The resin 20 is cured at about 120 to 150° C., and the solder bumps 16, including the base portions, are affixed and reinforced.

Figure 4C:
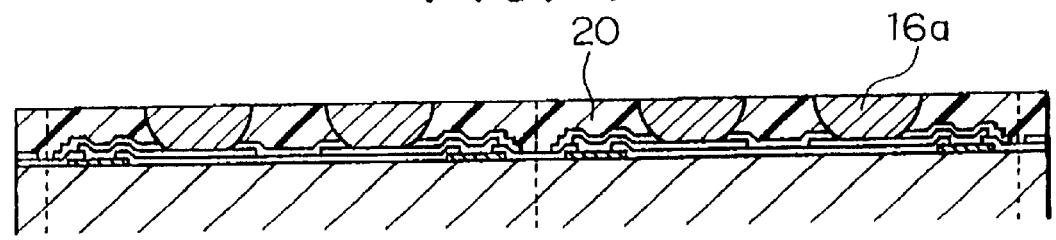

Next, as shown in FIG. 4C, the upper portions of the solder bumps 16 are polished to remove the resin covering the upper portions. This polishing is uniformly performed to the maximum diameter (the most expanded portion) of the bumps. Due to this, the upper surfaces of the solder bumps are refreshed with the solder exposed. Due to this, the primary bumps 16a are formed.

Figure 4D:
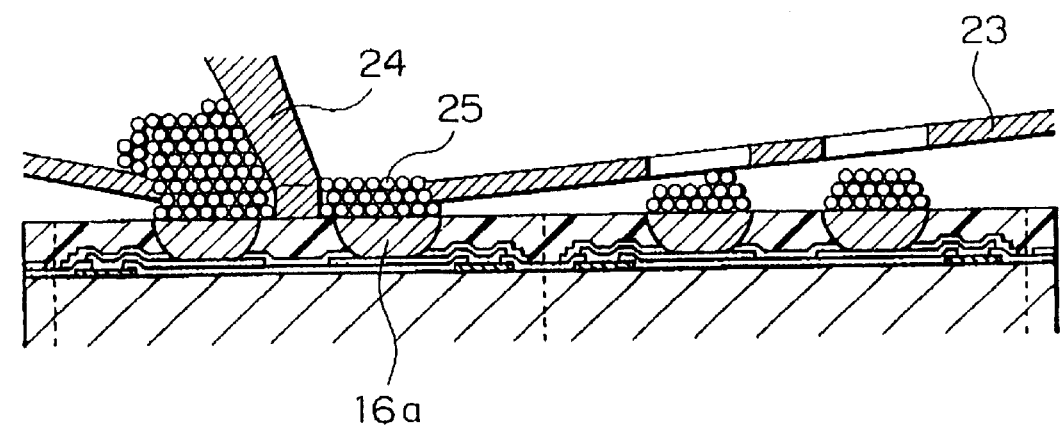

Next, as shown in FIG. 4D, cream solder 25 is applied by printing on the primary bumps 16a by a cream solder printing method via a mask 23 and using a squeegee 24.

Figure 5A:
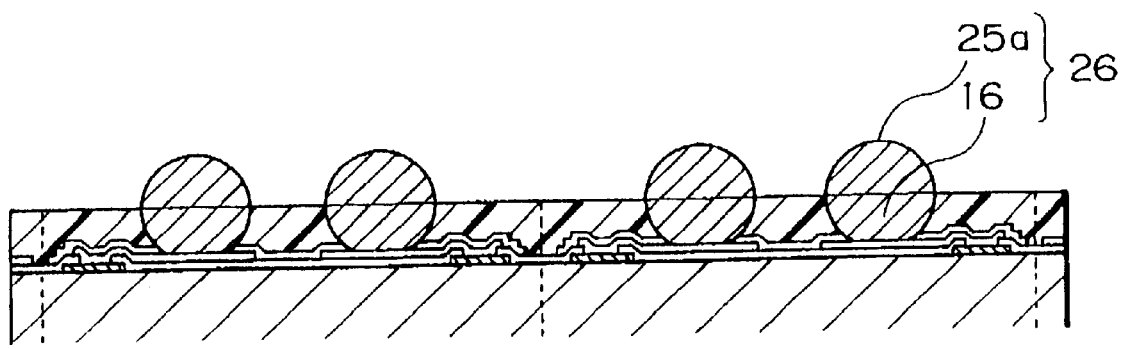
FIGS. 5A to 5C are explanatory views of the steps following those of FIGS. 4A to 4D.
Figure 5B:
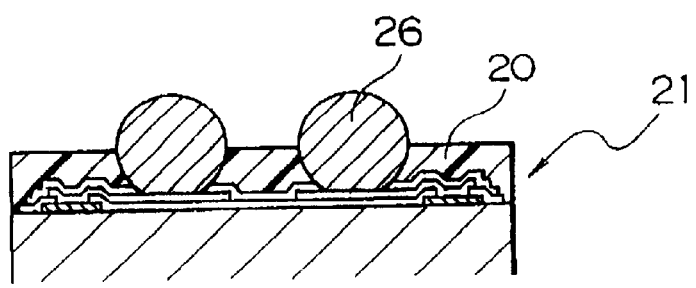
Figure 5C:
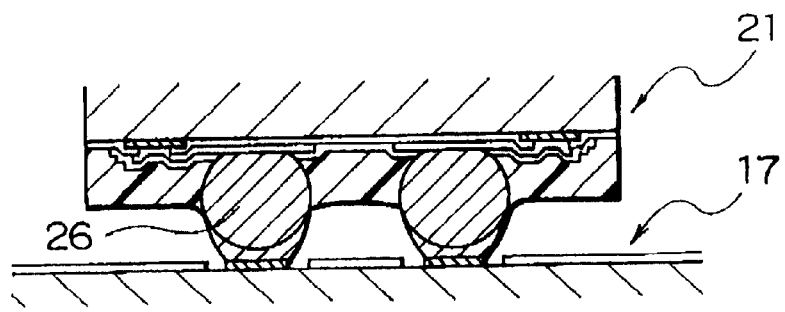
Figure 6A:
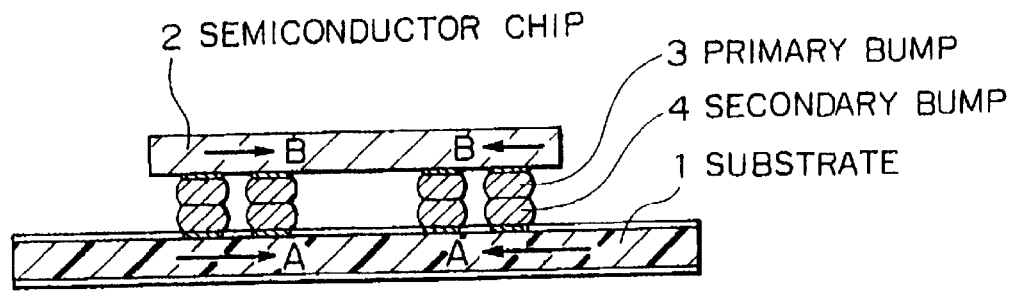
FIGS. 6A to 6C are explanatory views of disadvantages of a semiconductor device of the related art.
Figure 6B:
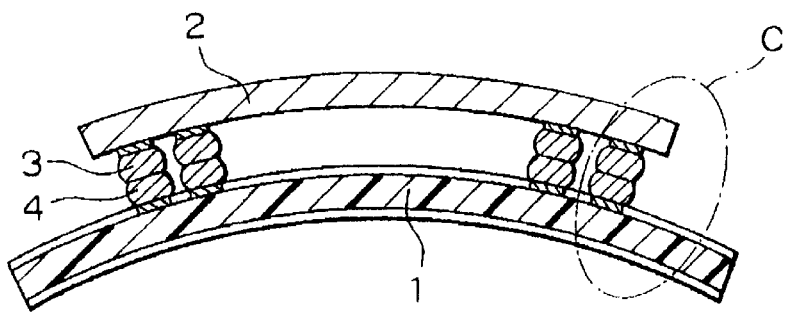
Figure 6C:
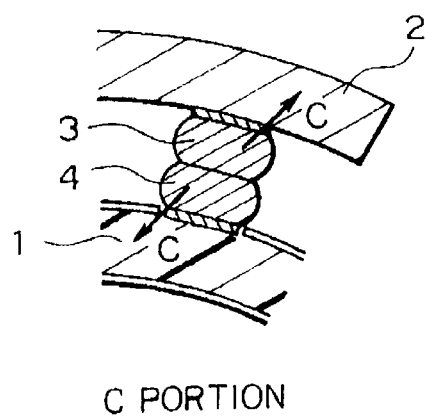

The cream solder 25 hardens in a rounded state by for example wet back heat treatment, and secondary bumps 25a are formed on the primary bumps 16a as shown in FIG. 5A to raise the height of the bumps and form high reliability bumps 26.

Next, the semiconductor chips 21 are cut from the wafer by dicing (FIG. 5B) and bonded on the board 17 (FIG. 5C) in the same way as in the above FIGS. 3C and 3D.

Note that a height difference may be provided between the upper surface of the spin-coated resin 20 and the refreshed surface of the polished primary bumps 16a so as to ease the stress concentration occurring at the bonding surface between the primary bumps 16a and the secondary bumps 15a.

Due to the polishing of the primary bumps, as explained above, the resin on the upper surfaces of the bumps are removed and an effect of increasing the area of the bonding surface can be obtained. When the bonding surface of the primary bumps and the secondary bumps is constricted to be narrow as in the above mentioned FIG. 1A, it is preferable that the bonding surface also be covered with the resin so as to sufficiently reinforce the bumps. Note that the bumps are not limited to solder and may be formed by Au, Cu, or their alloys or other metals.

Summarizing the effect of the invention, as explained above, in the present invention, since the narrowed bases portions of metal bumps are covered with resin for reinforcement, the reliability of the bonds is improved. Due to this, the stress of the bump portions is reduced and the reliability of the semiconductor package with respect to a temperature cycle is improved.

Further, when a flip-chip type semiconductor package is made larger, the stress applied to the solder bumps increases, so increasing the size has been difficult. However, by the reinforcement by resin of the present invention, a large-size semiconductor package mounting a large circuit can be realized. Also, since there is no need to reinforce the solder bonds with an underfill material, the reworkability is improved. Further, it is not necessary to provide bumps for reinforcement, that many more wiring bumps can be provided, so the space can be effectively used to attain high-density wiring.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor bonding assembly comprising:
   a bonding substrate comprising first metal bumps;
   a semiconductor chip substrate;
   second metal bumps bonded to the semiconductor chip substrate and to the first metal bumps, each second metal bump comprising a narrowed base portion and a polished surface at a polished bump height;
   a resin coating a surface of the semiconductor chip substrate at a coating height and covering the narrowed base portion; and
   gaps defined between the bonding substrate and the resin in which the resin does not contact the bonding substrate, wherein
   a height difference between the polished bump height and the coating height is between 10 microns and 50 microns.

2. A semiconductor bonding assembly as set forth in claim 1, wherein the resin has a Young's modulus of not less than about 1200 kgf/mm$^2$, a linear expansion rate of not more than about 20 ppm/° C., and a thickness of about 40 um to 110 um.

3. A semiconductor bonding assembly as set forth in claim 1, wherein the resin is inclined in a flared shape at the base portions of the metal bumps and buries the base portions.

4. A method for producing a semiconductor bonding assembly, the method comprising:
   forming first metal bumps with narrowed base portions on a wiring surface of a semiconductor device;
   coating a resin to a coating height and covering the base portions;
   polishing the metal bumps to form polished surfaces at a polished bump height;
   bonding the first metal bumps to second metal bumps on a bonding substrate and thereby defining gaps between the bonding substrate and the resin,
   wherein a height difference between the polished bump height and the coating height is between 10 microns and 50 microns.

5. A method of production of a semiconductor bonding assembly as set forth in claim 4, wherein
   the resin is coated by a spin-coating method and
   a Young's modulus of the resin is not less than about 1200 kgf/mm$^2$, a linear expansion rate is not more than about 20 ppm/° C., and a thickness is about 40 um to 110 um.

6. A method of production of a semiconductor bonding assembly as set forth in claim 4, wherein the resin is coated so that the resin is inclined in a flared shape at the base portions of the metal bumps and buries the base portions.

7. A semiconductor bonding assembly according to claim 1, wherein the resin rises near side surfaces of the metal bumps due to surface tension.

* * * * *